(12) United States Patent
Agranov et al.

(10) Patent No.: US 7,378,635 B2
(45) Date of Patent: May 27, 2008

(54) METHOD AND APPARATUS FOR DARK CURRENT AND HOT PIXEL REDUCTION IN ACTIVE PIXEL IMAGE SENSORS

(75) Inventors: Gennadiy Agranov, Boise, ID (US); Xiangli Li, Boise, ID (US); Peter Parker Altice, Meridian, ID (US); Rick Mauritzson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 11/055,105

(22) Filed: Feb. 11, 2005

(65) Prior Publication Data

US 2006/0180741 A1 Aug. 17, 2006

(51) Int. Cl.
*H01L 27/00* (2006.01)
*H01L 31/062* (2006.01)
*H01L 31/00* (2006.01)
*G01J 1/44* (2006.01)
*H04N 3/14* (2006.01)

(52) U.S. Cl. .............. 250/208.1; 250/214 R; 257/290; 257/445; 348/294; 348/302

(58) Field of Classification Search ............ 250/208.1, 250/214 R; 257/290, 440, 233, 291–293, 257/431, 445, 443; 348/300–310, 294, 295; 438/57, 60, 257, 240, 301, 308, 244, 211, 438/230

See application file for complete search history.

(56) References Cited

U.S. PATENT DOCUMENTS

| | | | |
|---|---|---|---|
| 6,140,630 A | 10/2000 | Rhodes | |
| 6,204,524 B1 | 3/2001 | Rhodes | |
| 6,246,043 B1* | 6/2001 | Merrill | 250/208.1 |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 7,022,965 B2* | 4/2006 | Manabe et al. | 250/208.1 |
| 7,250,665 B1* | 7/2007 | Toros et al. | 257/463 |
| 2002/0109160 A1* | 8/2002 | Mabuchi et al. | 257/233 |
| 2003/0085339 A1* | 5/2003 | Janesick | 250/208.1 |
| 2006/0082667 A1* | 4/2006 | Rhodes | 348/308 |

FOREIGN PATENT DOCUMENTS

| | | |
|---|---|---|
| EP | 1223623 | 7/2002 |
| EP | 1580987 | 8/2005 |
| WO | WO-03/050874 | 6/2003 |
| WO | WO-2004/062274 | 7/2004 |

* cited by examiner

*Primary Examiner*—Georgia Epps
*Assistant Examiner*—Pascal M Bui-Pho
(74) *Attorney, Agent, or Firm*—Dickstein Shapiro LLP

(57) ABSTRACT

A method of operating an imager pixel that includes the act of applying a relatively small voltage on the gate of a transfer transistor during a charge acquisition period. If a small positive voltage is applied, a depletion region is created under the transfer transistor gate, which creates a path for dark current electrons to be transferred to a pixel floating diffusion region. The dark electrons are subsequently removed by a pixel reset operation. If a small negative voltage is applied to the transfer gate, electrons that would normally create dark current problems will instead recombine with holes thereby substantially reducing dark current.

29 Claims, 18 Drawing Sheets

METHOD AND APPARATUS FOR DARK CURRENT AND HOT PIXEL REDUCTION IN ACTIVE PIXEL IMAGE SENSORS

FIELD OF THE INVENTION

The invention relates generally to imaging devices and more particularly to dark current and hot pixel reduction in active pixel image sensors.

BACKGROUND

A CMOS imager circuit includes a focal plane array of pixel cells, each one of the cells including a photosensor, for example, a photogate, photoconductor or a photodiode for accumulating photo-generated charge in the specified portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state before the transfer of charge to it; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

A typical four transistor (4T) CMOS imager pixel 10 is shown in FIG. 1. The pixel 10 includes a photosensor 12, implemented as a pinned photodiode, transfer transistor 14, floating diffusion region FD, reset transistor 16, source follower transistor 18 and row select transistor 20. The photosensor 12 is connected to the floating diffusion region FD by the transfer transistor 14 when the transfer transistor 14 is activated by a transfer gate control signal TX.

The reset transistor 16 is connected between the floating diffusion region FD and a pixel supply voltage Vpix. A reset control signal RST is used to activate the reset transistor 16, which resets the floating diffusion region FD to the pixel supply voltage Vpix level as is known in the art.

The source follower transistor 18 has its gate connected to the floating diffusion region FD and is connected between an array supply voltage Vaa and the row select transistor 20. The source follower transistor 18 converts the charge stored at the floating diffusion region FD into an electrical output voltage signal PIX OUT. The row select transistor 20 is controllable by a row select signal SEL for selectively connecting the source follower transistor 18 and its output voltage signal PIX OUT to a column line 22 of a pixel array.

FIG. 1b illustrates a typical timing diagram for the readout and photo-charge acquisition operations for the pixel 10 illustrated in FIG. 1a. FIG. 1b illustrates a first readout period 30 in which previously stored photo-charges are readout of the pixel 10. During this first readout period 30, the reset control signal RST is pulsed to activate the reset transistor 16, which resets the floating diffusion region FD to the pixel supply voltage Vpix level. While the SEL signal is high, a sample and hold reset signal SHR is pulsed to store a reset signal Vrst (corresponding to the reset floating diffusion region FD) on a sample and hold capacitor. The transfer control signal TX is then activated to allow photo-charges from the photosensor 12 to be transferred to the floating diffusion region FD. While the SEL signal remains high, a sample and hold pixel signal SHS is pulsed to store a pixel signal Vsig from the pixel 10 on another sample and hold capacitor.

During the acquisition period 32, the reset control signal RST, transfer control signal TX and sample and hold signals SHR, SHS are set to a ground potential GRND. It is during the acquisition period 32 that the photosensor 12 accumulates photo-charge based on the light incident on the photosensor 12. After the acquisition period 32, a second readout period 34 begins. During the second readout period 34, the photo-charges accumulated in the acquisition period 32 are readout of the pixel 10 (as described above for period 30).

One common problem associated with conventional imager pixel cells, such as pixel cell 10, is dark current (that is, current generated as a photodiode signal in the absence of light). As shown in the potential diagram of FIG. 1c, a major component of dark current occurs underneath the gate of the transfer transistor 14. These "dark carriers" 25 are accumulated on the pinned photodiode photosensor 12 during integration (i.e., during the acquisition period 32), which creates parasitic dark charge that is added to the light signals when they are readout. This is undesirable.

Accordingly, there is a desire and need to reduce dark current and the factors that cause dark current in imagers.

SUMMARY

The invention provides a method of operating an imager pixel such that dark current and the factors that cause dark current in imagers are reduced.

The above and other features and advantages are achieved in various exemplary embodiments of the invention by a method of operating an imager pixel that includes the act of applying a relatively small voltage on the gate of a transfer transistor during a charge acquisition period. If a small positive voltage is applied, a depletion region is created under the transfer transistor gate, which creates a path for dark current electrons to be transferred to a pixel floating diffusion region. The dark electrons are subsequently removed by a pixel reset operation. If a small negative voltage is applied to the transfer gate, electrons that would normally create dark current problems will instead recombine with holes thereby substantially reducing dark current.

In other aspects of the invention, the application of the small positive or negative voltage is dependent upon the imager's gain settings being used at that time. By monitoring the gain of the imager, which is indicative of the light intensity on the imager pixels, the small positive or negative voltage will be applied to the gate of the transfer transistor under high gain (or dark) conditions only. For low gain (or bright light) conditions, a ground potential or zero voltage is applied to the gate of the transfer transistor. For embodiments using a small positive voltage, this provides maximum hot pixel reduction for the high gain conditions, while allowing maximum full well capacity for the low gain conditions. For embodiments using a small negative voltage, this provides maximum electron recombination for the high gain conditions, while avoiding blooming issues during the low gain conditions.

In yet another aspect of the invention, the voltage applied to the transfer gate is scaled according to the gain setting of the imager at the time. That is, a range of different voltages (both negative and positive) may be applied to the gate of the transfer transistor based on a range of gain settings between the high and low gain settings, providing dark current and hot pixel reduction at high gain, preserving full well capacity at low gain, and allowing anti-blooming protection at saturated conditions.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

The inventors have determined that the accumulation of dark charges 25 (FIG. 1c) from dark current generated underneath the transfer transistor 14 (FIG. 1a) can be substantially reduced by applying a relatively small voltage to the gate of the transfer transistor 14 during the charge acquisition cycle (also known as an integration period). In a first exemplary embodiment of the invention, the small voltage is a relatively small positive voltage (e.g., within a range of greater than 0V to approximately 0.8V). In a second exemplary embodiment of the invention, the small voltage is a relatively small negative voltage (e.g., within a range of less than 0V to approximately −0.6V).

Figure 1A:
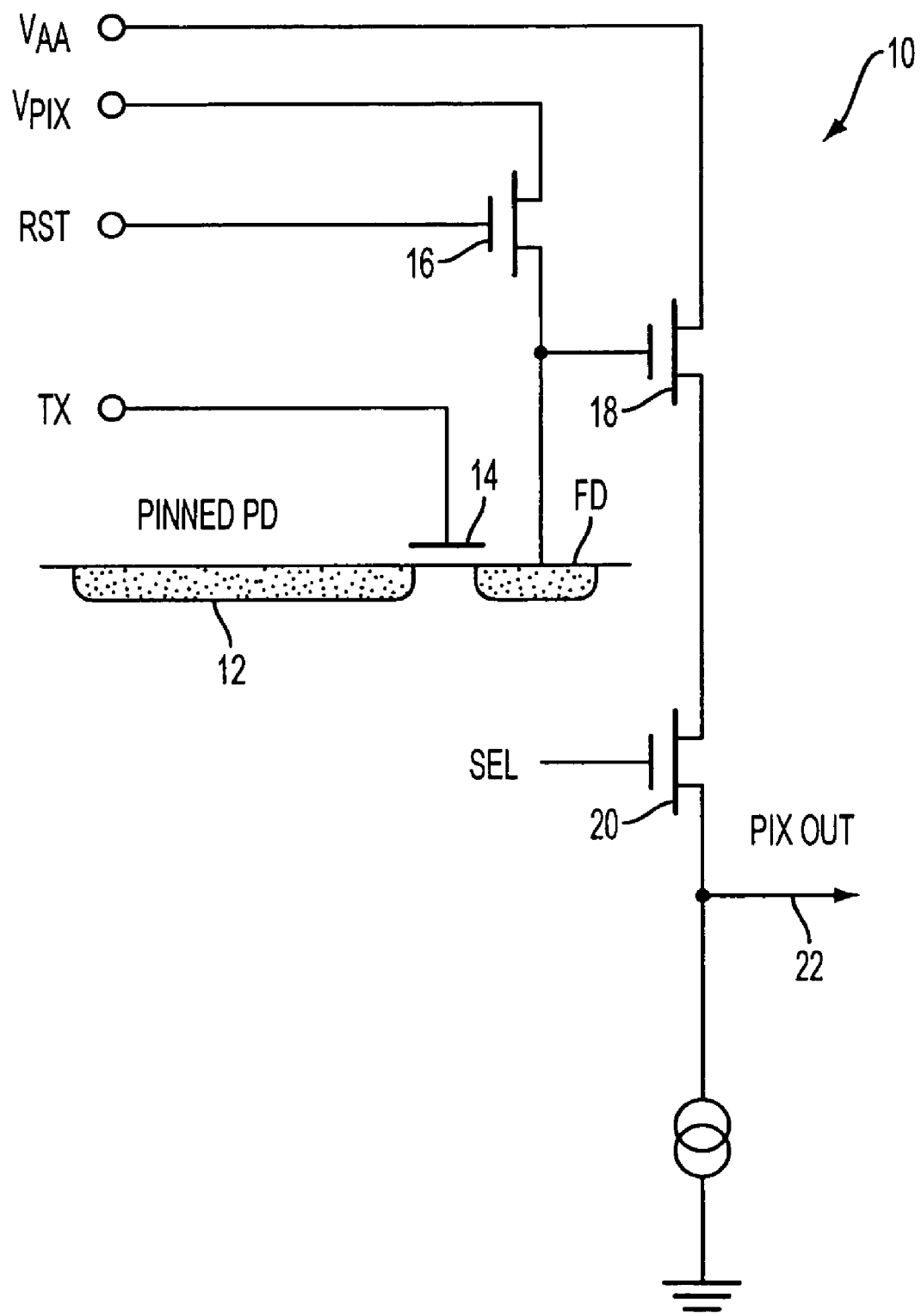
FIG. 1a illustrates a conventional imager pixel circuit.
Figure 2A:
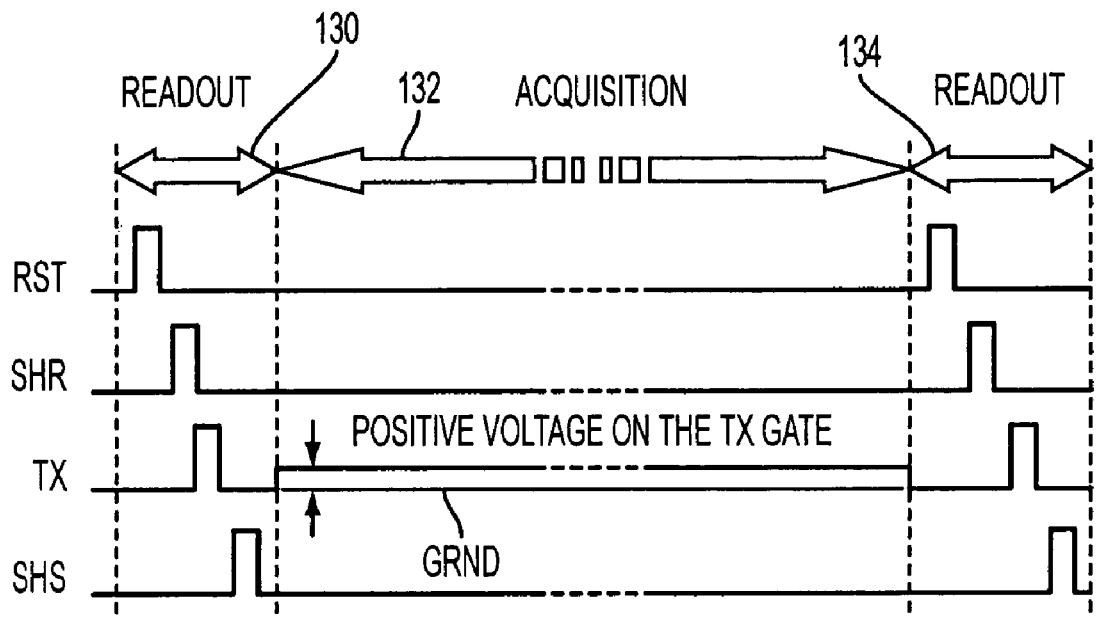
FIG. 2a illustrates a timing diagram for operating the pixel circuit of FIG. 1a in accordance with an exemplary embodiment of the invention.
Figure 2B:
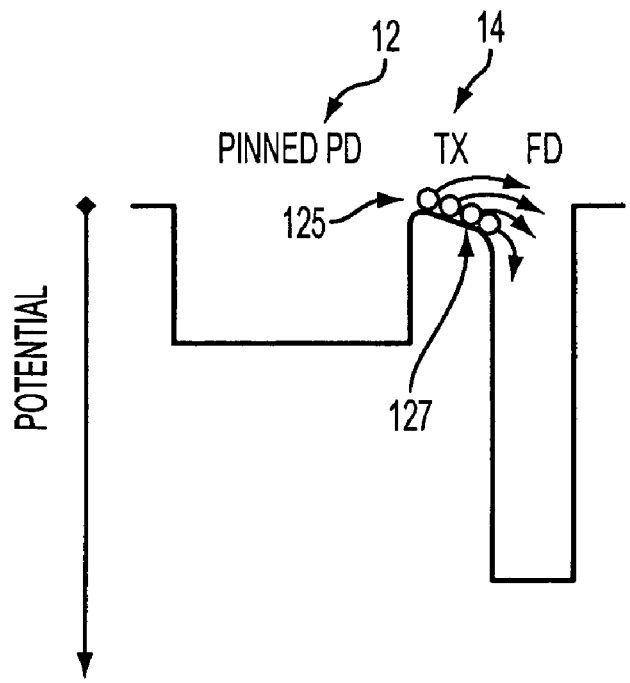
FIG. 2b illustrates a voltage potential diagram for the pixel circuit of FIG. 1a when operated in accordance with the FIG. 2a timing diagram.
Figure 2C:
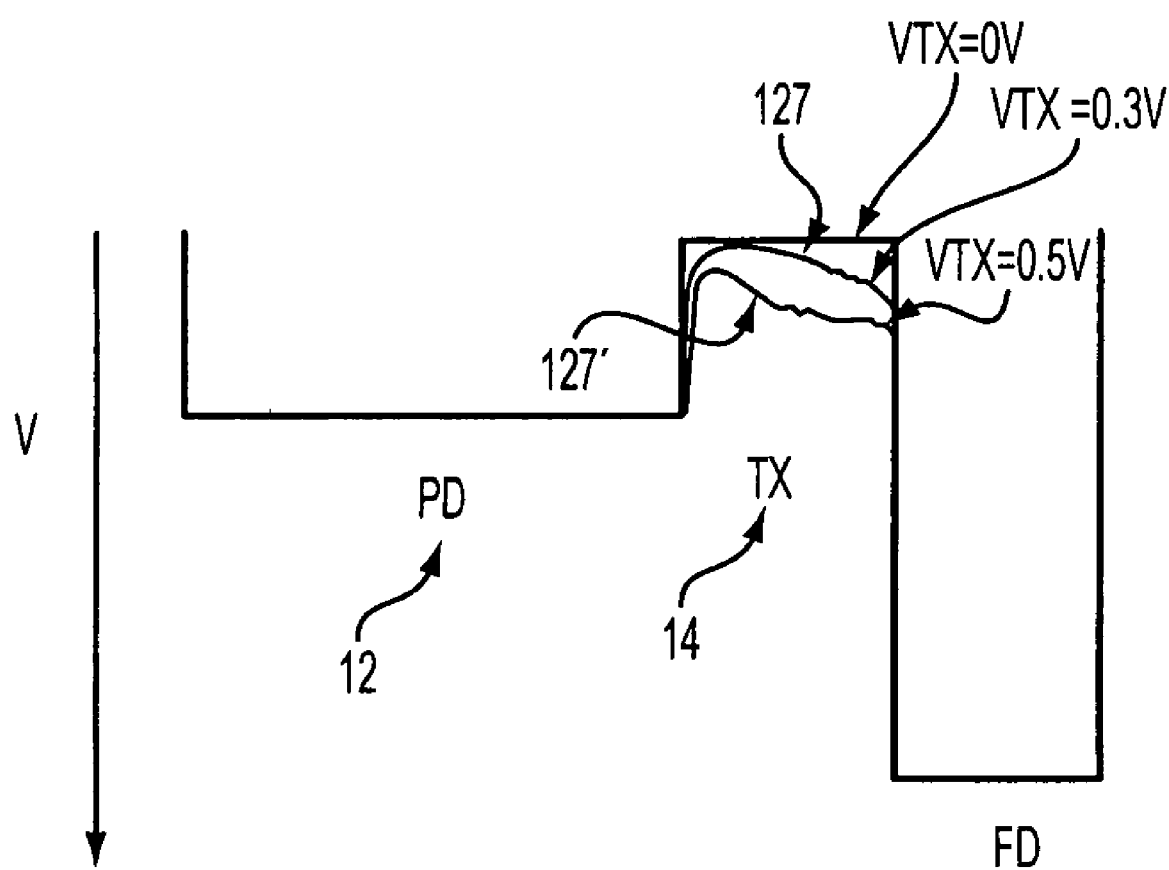
FIG. 2c illustrates another voltage potential diagram for the pixel circuit of FIG. 1a when operated in accordance with the invention.

FIG. 2a illustrates a timing diagram for operating a pixel circuit such as the pixel circuit 10 of FIG. 1a in accordance with a first exemplary embodiment of the invention. FIGS. 2b and 2c illustrate voltage potential diagrams for the pixel circuit 10 (FIG. 1a) when operated in accordance with the FIG. 2a timing diagram.

Figure 1B:
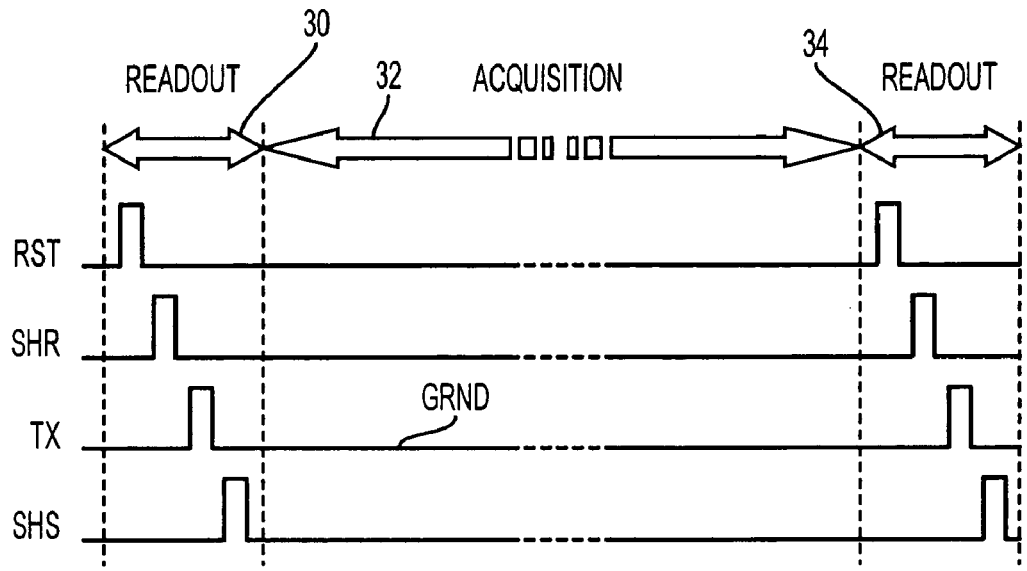
FIG. 1b illustrates a timing diagram for operating the pixel circuit of FIG. 1a in a conventional manner.

FIG. 2a illustrates two readout periods 130, 134 and an acquisition period 132. The two readout periods 130, 134 are the same as the conventional readout periods 30, 34 discussed above with reference to FIG. 1b. That is, during this first readout period 130, for example, the reset control signal RST is pulsed to activate the reset transistor 16 (FIG. 1c), which resets the floating diffusion region FD to the pixel supply voltage Vpix level. While the SEL signal is high, a sample and hold reset signal SHR is pulsed to store a reset signal Vrst (corresponding to the reset floating diffusion region FD) on a sample and hold capacitor. The transfer control signal TX is activated to allow photo-charges from the photosensor 12 to be transferred to the floating diffusion region FD. While the SEL signal is still high, a sample and hold pixel signal SHS is pulsed to store a pixel signal Vsig from the pixel on another sample and hold capacitor.

Figure 1C:
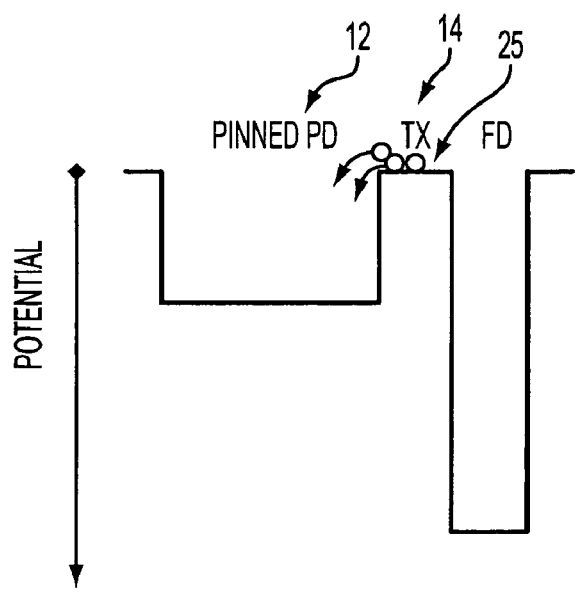
FIG. 1c illustrates a voltage potential diagram for the pixel circuit of FIG. 1a when operated in accordance with the FIG. 1b timing diagram.

Dark electrons 125 are generated underneath the gate of the transfer transistor 14 in the region next to the pinned photodiode photosensor 12. The dark electrons 125 may result from the surface states or bulk substrate in that area. The inventors have determined that the accumulation of the dark charges 125 can be substantially reduced by applying a relatively small positive voltage to the gate of the transfer transistor 14 during the acquisition cycle 132. As is shown in the potential diagram of FIG. 2b, the application of the slightly positive voltage on the gate of the transfer transistor 14 (FIG. 1a) creates a depletion region 127 underneath the transfer transistor (TX) gate. The depletion region 127 serves as a path for the dark electrons 125 to reach the floating diffusion region FD. Due to the difference in potentials between the photodiode photosensor 12 and the floating diffusion region FD, the dark carriers 125 flow to the floating diffusion region FD and are drained away during a subsequent reset operation instead of being captured by the photosensor 12 (as shown in FIG. 1c). The remainder of the acquisition cycle 132 is substantially the same as the conventional acquisition cycle 32 discussed above with reference to FIG. 1b.

The value of the small positive voltage depends on the threshold voltage of the transfer transistor 14, but a desired range for the voltage is from slightly greater than 0V to a voltage greater than a threshold voltage of the transfer transistor 14. For a regular CMOS-imager process, the upper limit of the voltage range corresponds to approximately 0.7-0.8 V. The maximum positive voltage could be limited by ESD (electro static discharge) circuits in the real CMOS-imager design. In this and all other examples, the voltage on the gate of the transfer transistor 14 is referenced to the substrate voltage. FIG. 2c. illustrates how different voltages VTX effect the depletion region underneath the transfer transistor 14 gate. That is, when the voltage VTX is set to 0V, the region underneath the transfer transistor is similar to the region depicted in FIG. 1c for the conventional pixel operation. When the voltage VTX is set to 0.3V, there is a depletion region 127 having a first slope underneath the transfer transistor 14. When the voltage VTX is set to 0.5V, there is a depletion region 127' having a second slope underneath the transfer transistor 14. The manner in which different positive transfer gate voltages VTX effect the reduction of dark current is described below with reference to FIGS. 4a-6f.

Figure 3A:
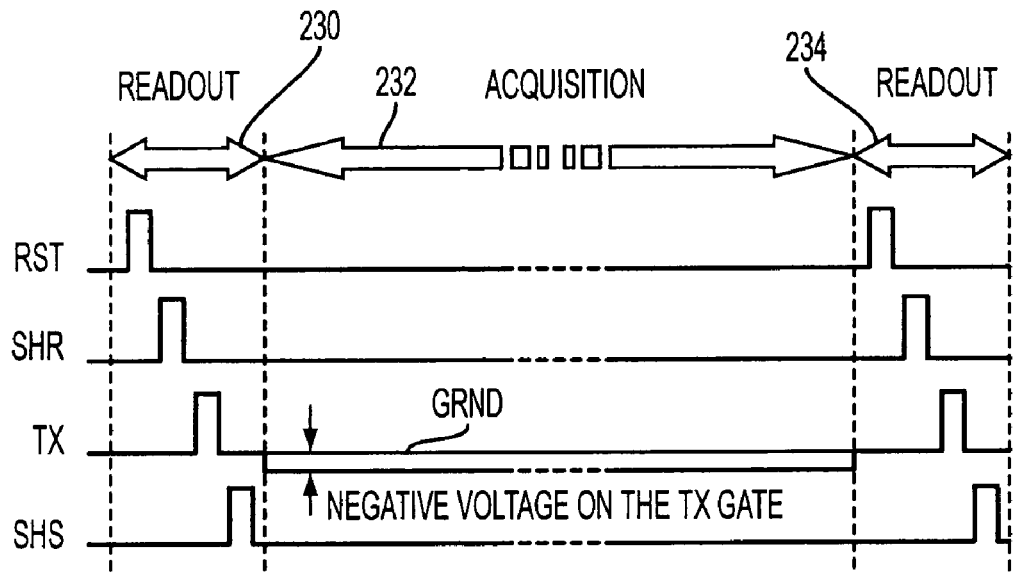
FIG. 3a illustrates a timing diagram for operating the pixel circuit of FIG. 1a in accordance with another exemplary embodiment of the invention.
Figure 3B:
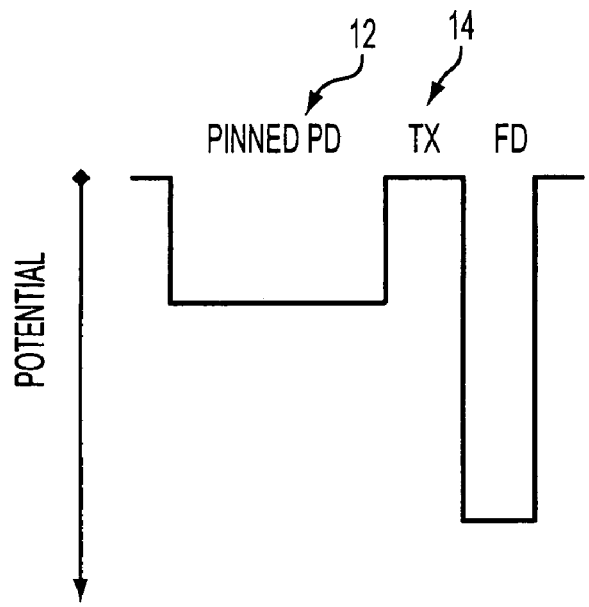
FIG. 3b illustrates a voltage potential diagram for the pixel circuit of FIG. 1a when operated in accordance with the FIG. 3a timing diagram.

FIG. 3a illustrates a timing diagram for operating a pixel circuit, such as the pixel circuit 10 illustrated in FIG. 1a, in accordance with another exemplary embodiment of the invention. FIG. 3b illustrates a voltage potential diagram for the pixel circuit when operated in accordance with the FIG. 3a timing diagram. In the illustrated embodiment of the invention, a small negative voltage is applied to the gate of the transfer transistor 14 during the acquisition period 232 (described below in more detail).

FIG. 3a illustrates two readout periods 230, 234 and an acquisition period 232. The two readout periods 230, 234 are the same as the conventional readout periods 30, 34 discussed above with reference to FIG. 1b. That is, during this first readout period 230, for example, the reset control signal RST is pulsed to activate the reset transistor 16 (FIG. 1c), which resets the floating diffusion region FD to the pixel supply voltage Vpix level. A sample and hold reset signal SHR is pulsed to store a reset signal Vrst (corresponding to the reset floating diffusion region FD) on a sample and hold capacitor. The transfer control signal TX is activated to allow photo-charges from the photosensor 12 to be transferred to the floating diffusion region FD. A sample and hold pixel signal SHS is pulsed to store a pixel signal Vsig from the pixel on another sample and hold capacitor.

Dark electrons (not shown) are generated underneath the gate of the transfer transistor 14 in the region next to the pinned photodiode photosensor 12. The inventors have determined that by applying a relatively small negative voltage to the gate of the transfer transistor 14 during the acquisition period 232, the concentration of holes in the region underneath the transfer transistor gate increases. When this happens, dark electrons generated from the surface states under the transfer transistor gate and/or from the bulk substrate of the pixel quickly recombine, leaving only a relatively small probability that the electrons will get captured by the photosensor 12. Thus, dark current and the factors that cause dark current are substantially reduced. FIG. 3b illustrates the case where all electrons are recombined (i.e., no dark electrons are shown).

The value of the small negative voltage depends on the threshold voltage of the transfer transistor 14, but a desired range for the voltage is from slightly less than 0V to a negative voltage with an absolute value higher than the absolute value of the threshold voltage of the transfer transistor 14. For a regular CMOS-imager process, the lower limit of the voltage range corresponds to $(-0.7)-(-0.8)$ V. The minimum negative voltage could be limited by ESD circuits in the real CMOS-imager design. The manner in which different negative transfer gate voltages effect the reduction of dark current is described below with reference to FIGS. 4a-6f.

Figure 4A:
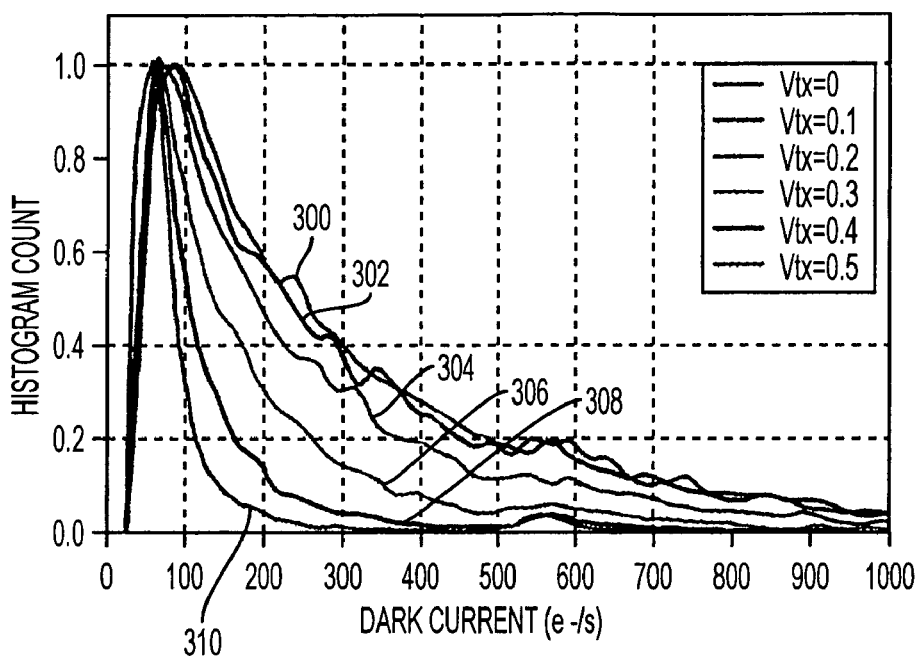
FIGS. 4a-4f are histograms illustrating how the invention reduced dark current in a first experiment using pixels having a first size.
Figure 4B:
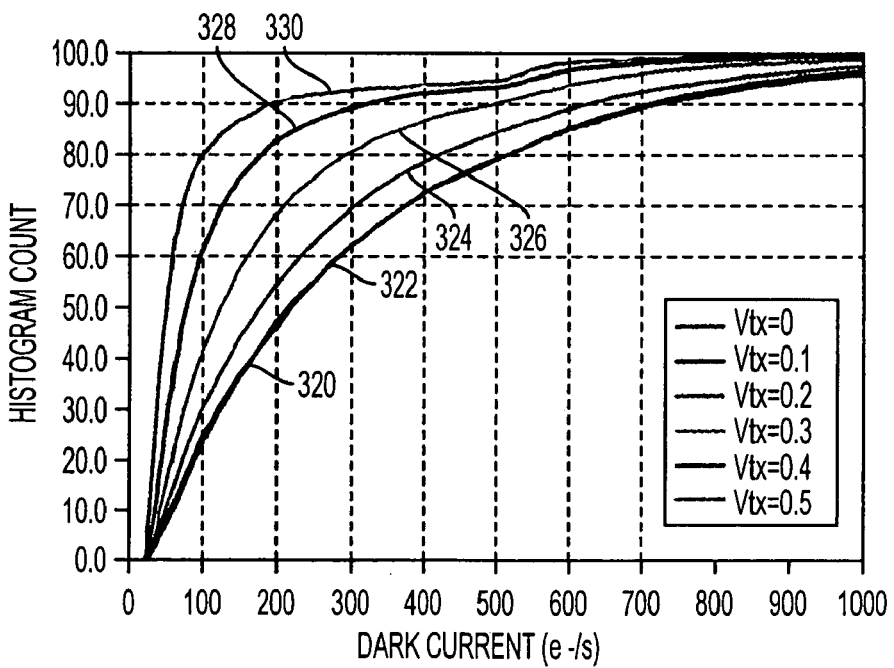

FIGS. 4a-4f are histograms illustrating how the invention reduced dark current in a first experiment using a test pixel array having 5.2 μm pixels. FIG. 4a is a histogram showing dark current across the test pixel array when no voltage and small positive voltages are applied to the transfer transistor gate. Curve 300 represents the dark current when no voltage is applied to the transfer transistor gate. Curves 302, 304, 306, 308, 310 represent the dark current when 0.1, 0.2, 0.3, 0.4, 0.5 volts, respectively, are applied to the transfer transistor gate. FIG. 4b is a histogram showing cumulative dark current across the test pixel array when no voltage and small positive voltages are applied to the transfer transistor gate. Curve 320 represents the cumulative dark current when no voltage is applied to the transfer transistor gate. Curves 322, 324, 326, 328, 330 represent the cumulative dark current when 0.1, 0.2, 0.3, 0.4, 0.5 volts, respectively, are applied to the transfer transistor gate.

Figure 4C:
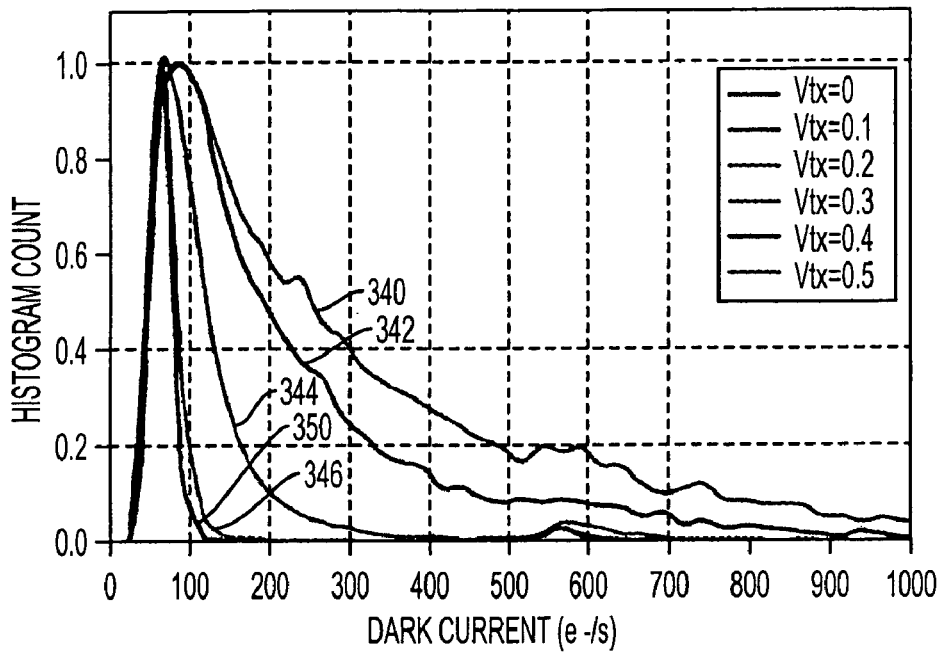
Figure 4D:
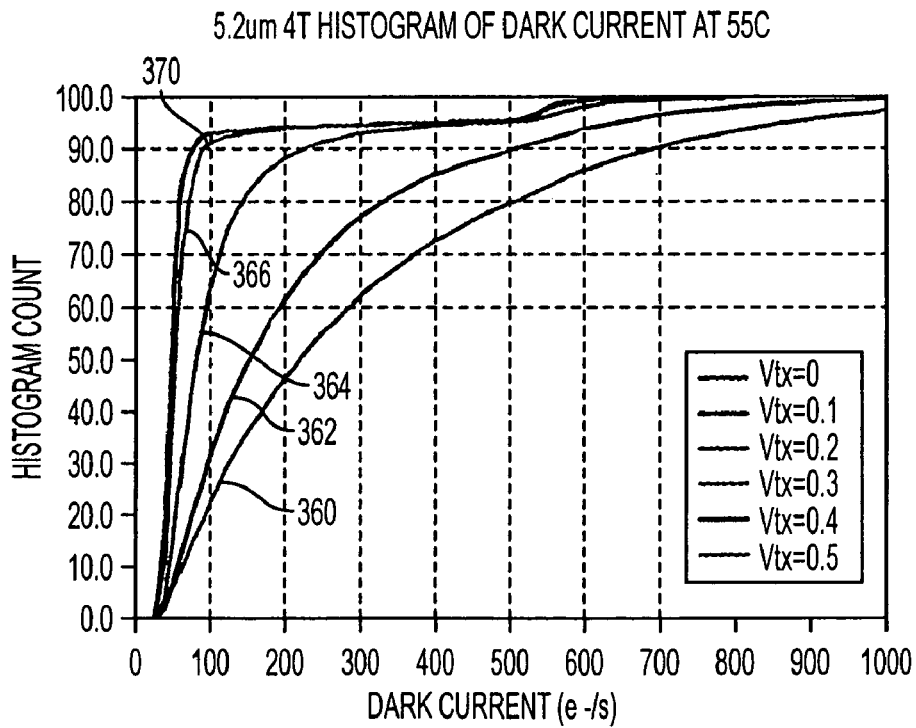

FIG. 4c is a histogram showing dark current across the test pixel array when no voltage and small negative voltages are applied to the transfer transistor gate. Curve 340 represents the dark current when no voltage is applied to the transfer transistor gate. Curves 342, 344, 346, 350 represent the dark current when −0.1, −0.2, −0.3, −0.5 volts, respectively, are applied to the transfer transistor gate. FIG. 4d is a histogram showing cumulative dark current across the test pixel array when no voltage and small negative voltages are applied to the transfer transistor gate. Curve 360 represents the cumulative dark current when no voltage is applied to the transfer transistor gate. Curves 362, 364, 366, 370 represent the cumulative dark current when −0.1, −0.2, −0.3, −0.5 volts, respectively, are applied to the transfer transistor gate.

Figure 4E:
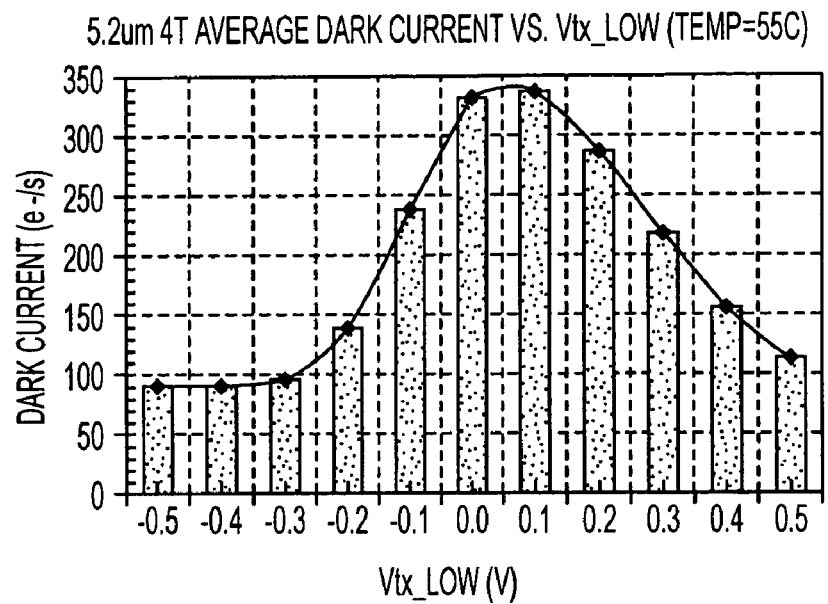
Figure 4F:
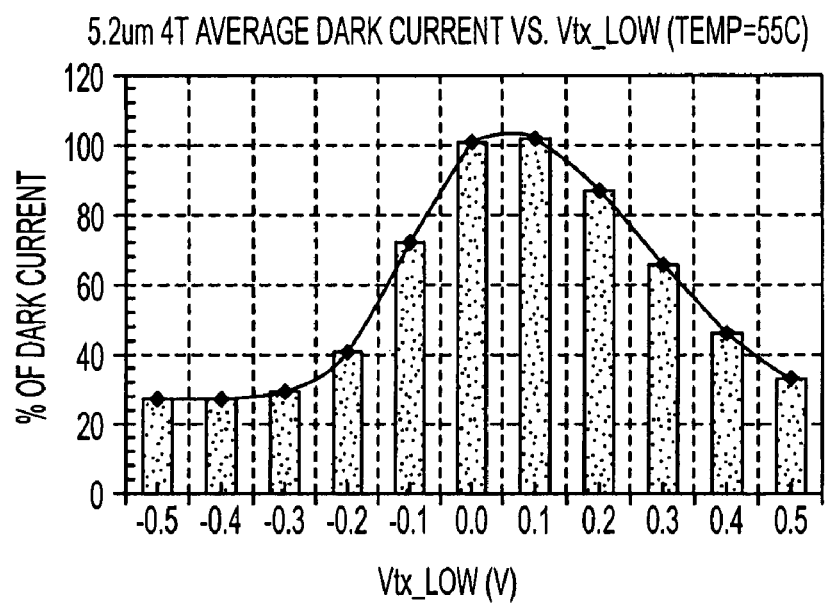

FIG. 4e illustrates the average dark current for the experimental array having 5.2 μm pixels while FIG. 4f illustrates the percentage of average dark current for the experimental array. As shown in the graphs, the percentage of dark current is dramatically reduced when either the small positive voltage or small negative voltage are applied to the transfer gates of the test pixel array during the acquisition period.

Figure 5A:
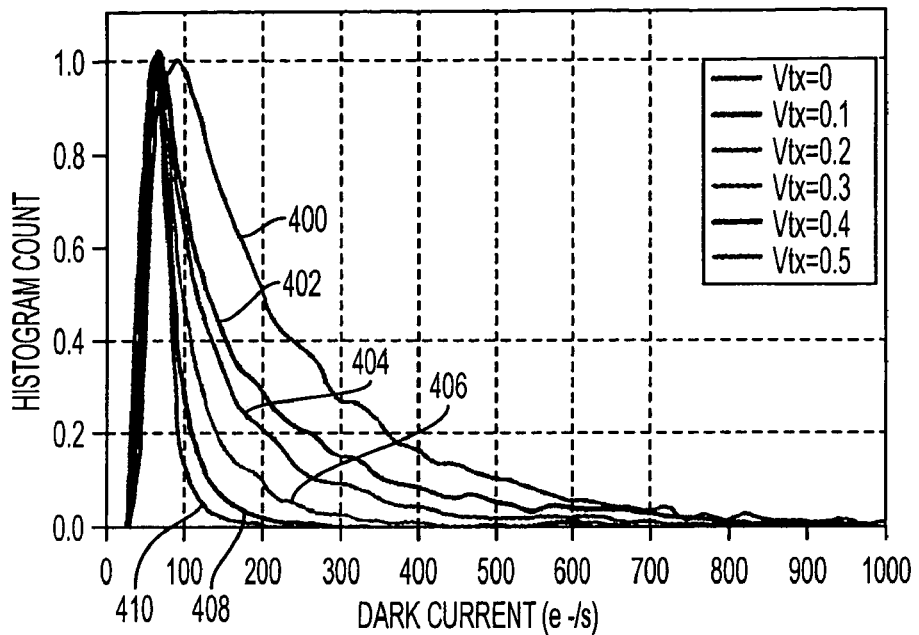
FIGS. 5a-5f are histograms illustrating how the invention reduced dark current in a second experiment using pixels having a second size.
Figure 5B:
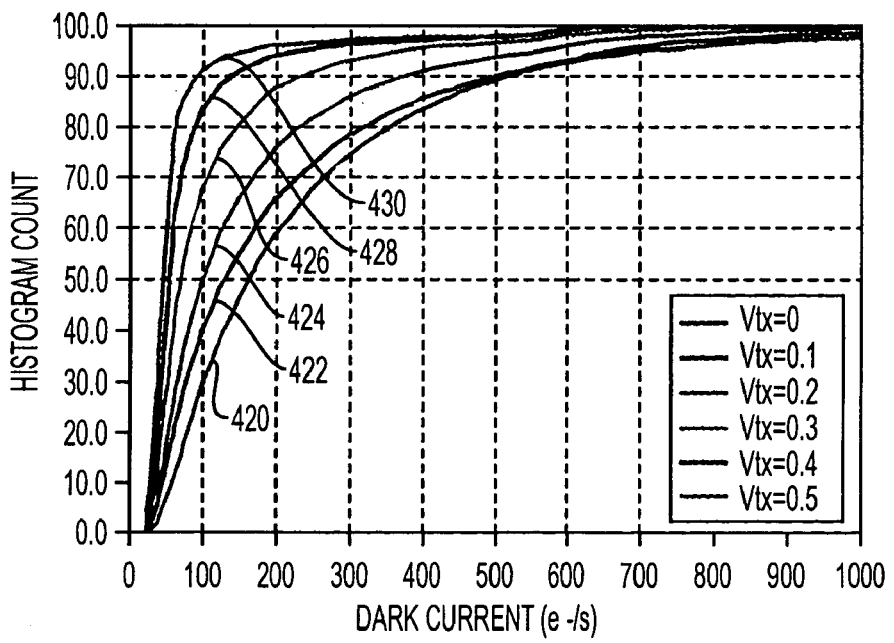

FIGS. 5a-5f are histograms illustrating how the invention reduced dark current in a second experiment using a test pixel array having 4.2 μm pixels. FIG. 5a is a histogram showing dark current across the test pixel array when no voltage and small positive voltages are applied to the transfer transistor gate. Curve 400 represents the dark current when no voltage is applied to the transfer transistor gate. Curves 402, 404, 406, 408, 410 represent the dark current when 0.1, 0.2, 0.3, 0.4, 0.5 volts, respectively, are applied to the transfer transistor gate. FIG. 5b is a histogram showing cumulative dark current across the test pixel array when no voltage and small positive voltages are applied to the transfer transistor gate. Curve 420 represents the cumulative dark current when no voltage is applied to the transfer transistor gate. Curves 422, 424, 426, 428, 430 represent the cumulative dark current when 0.1, 0.2, 0.3, 0.4, 0.5 volts, respectively, are applied to the transfer transistor gate.

Figure 5C:
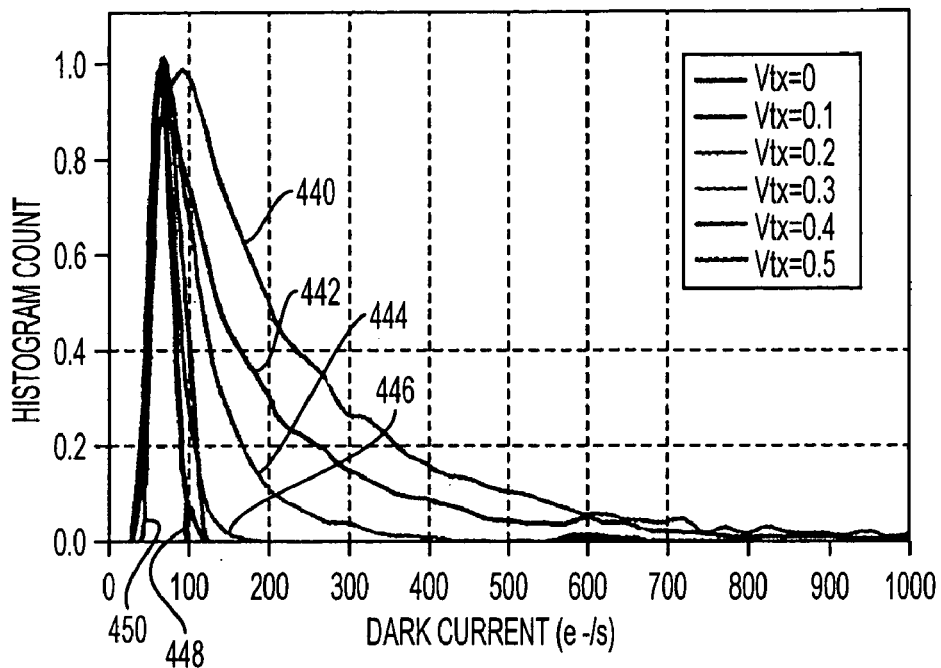
Figure 5D:
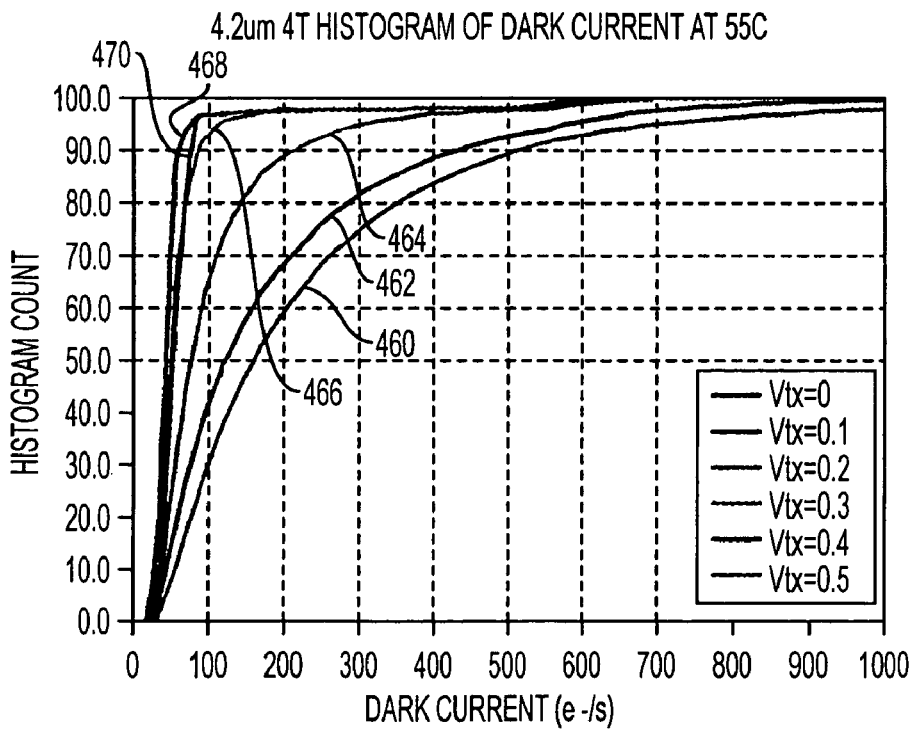

FIG. 5c is a histogram showing dark current across the test pixel array when no voltage and small negative voltages are applied to the transfer transistor gate. Curve 440 represents the dark current when no voltage is applied to the transfer transistor gate. Curves 442, 444, 446, 448, 450 represent the dark current when −0.1, −0.2, −0.3, −0.4, −0.5 volts, respectively, are applied to the transfer transistor gate. FIG. 5d is a histogram showing cumulative dark current across the test pixel array when no voltage and small negative voltages are applied to the transfer transistor gate. Curve 460 represents the cumulative dark current when no voltage is applied to the transfer transistor gate. Curves 462, 464, 466, 468, 470 represent the cumulative dark current when −0.1, −0.2, −0.3, −0.4, −0.5 volts, respectively, are applied to the transfer transistor gate.

Figure 5E:
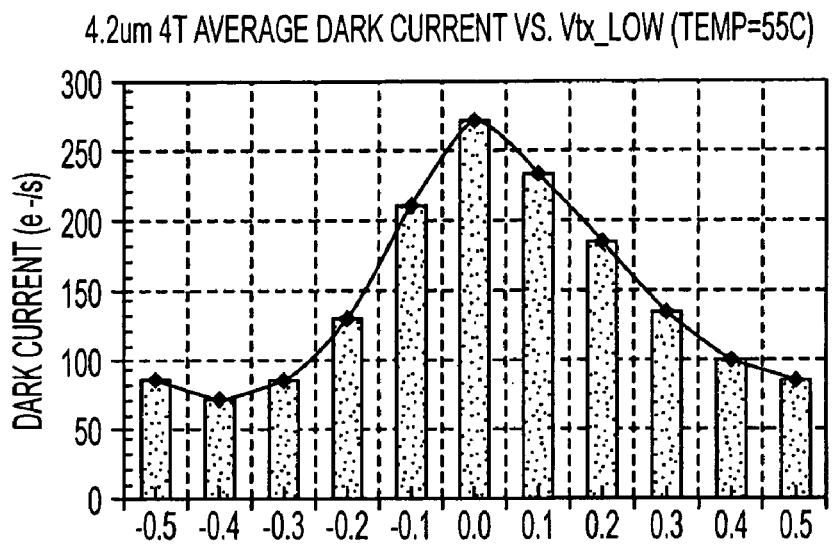
Figure 5F:
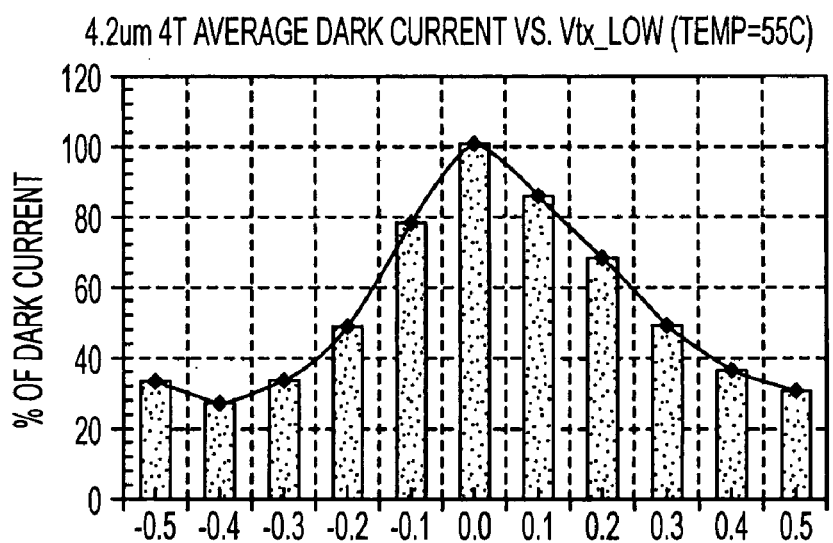

FIG. 5e illustrates the average dark current for the experimental array having 4.2 µm pixels while FIG. 5f illustrates the percentage of average dark current for the experimental array. As shown in the graphs, the percentage of dark current is dramatically reduced when either the small positive voltage or small negative voltage are applied to the transfer gates of the test pixel array during the acquisition period.

Figure 6A:
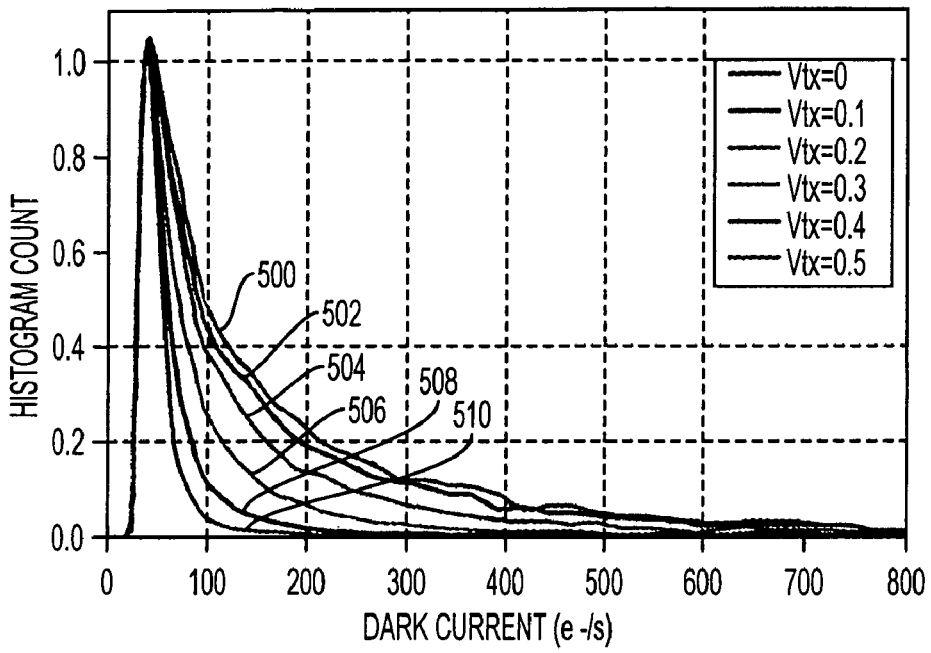
FIGS. 6a-6f are histograms illustrating how the invention reduced dark current in a third experiment using pixels having a third size.
Figure 6B:
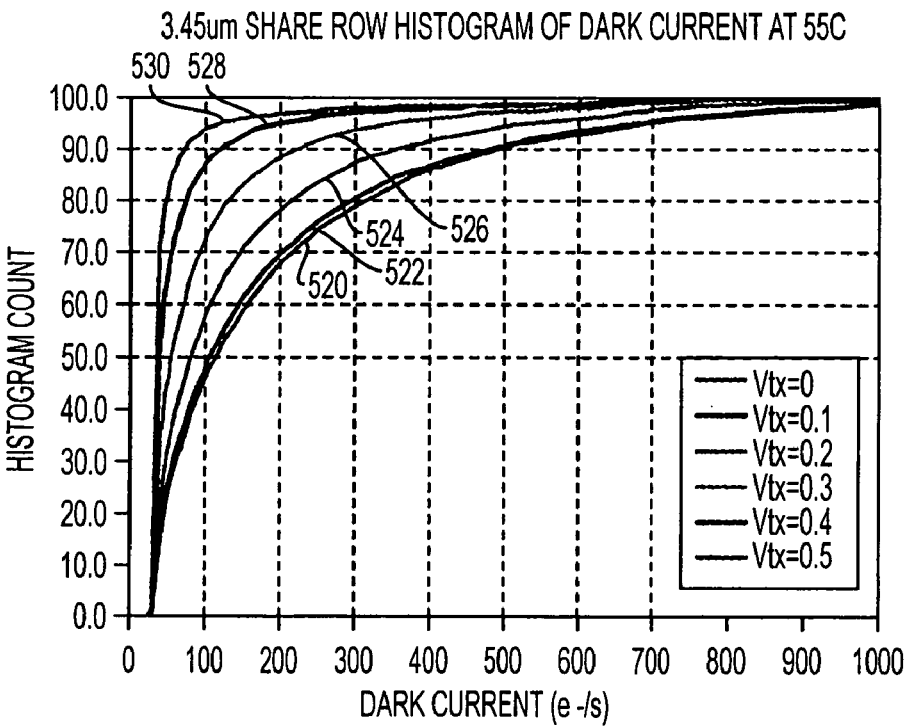

FIGS. 6a-6f are histograms illustrating how the invention reduced dark current in a third experiment using a test pixel array having 3.2 µm pixels. FIG. 6a is a histogram showing dark current across the test pixel array when no voltage and small positive voltages are applied to the transfer transistor gate. Curve 500 represents the dark current when no voltage is applied to the transfer transistor gate. Curves 502, 504, 506, 508, 510 represent the dark current when 0.1, 0.2, 0.3, 0.4, 0.5 volts, respectively, are applied to the transfer transistor gate. FIG. 6b is a histogram showing cumulative dark current across the test pixel array when no voltage and small positive voltages are applied to the transfer transistor gate. Curve 520 represents the cumulative dark current when no voltage is applied to the transfer transistor gate. Curves 522, 524, 526, 528, 530 represent the cumulative dark current when 0.1, 0.2, 0.3, 0.4, 0.5 volts, respectively, are applied to the transfer transistor gate.

Figure 6C:
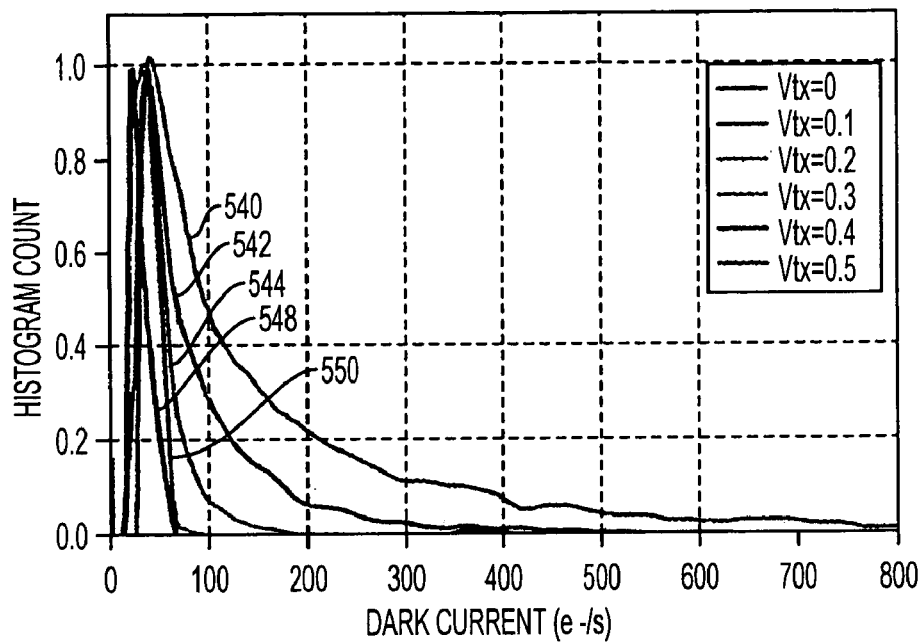
Figure 6D:
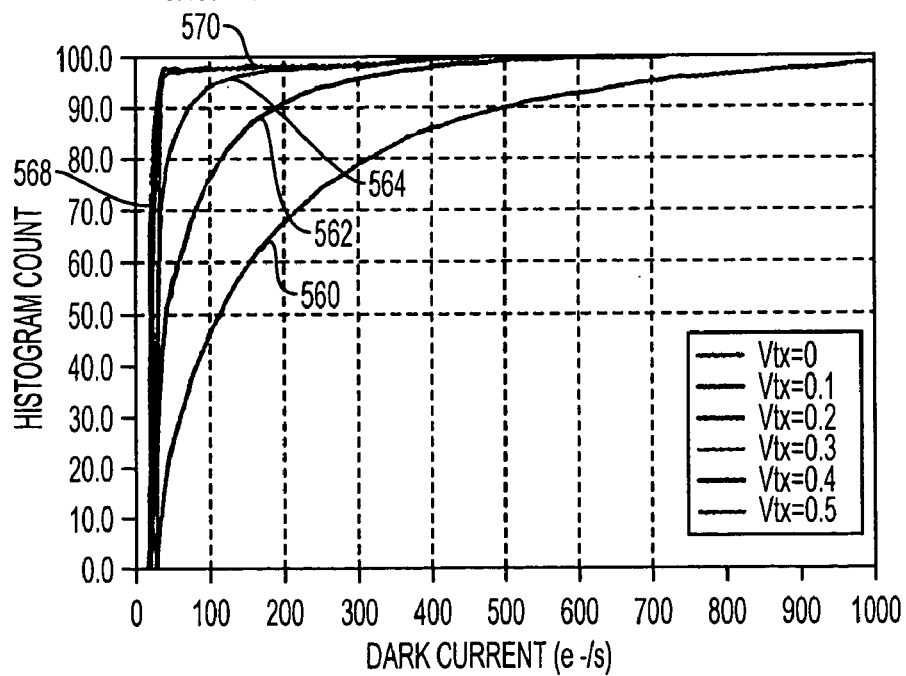

FIG. 6c is a histogram showing dark current across the test pixel array when no voltage and small negative voltages are applied to the transfer transistor gate. Curve 540 represents the dark current when no voltage is applied to the transfer transistor gate. Curves 542, 544, 548, 550 represent the dark current when −0.1, −0.2, −0.4, −0.5 volts, respectively, are applied to the transfer transistor gate. FIG. 6d is a histogram showing cumulative dark current across the test pixel array when no voltage and small negative voltages are applied to the transfer transistor gate. Curve 560 represents the cumulative dark current when no voltage is applied to the transfer transistor gate. Curves 562, 564, 568, 570 represent the cumulative dark current when −0.1, −0.2, −0.4, −0.5 volts, respectively, are applied to the transfer transistor gate.

Figure 6E:
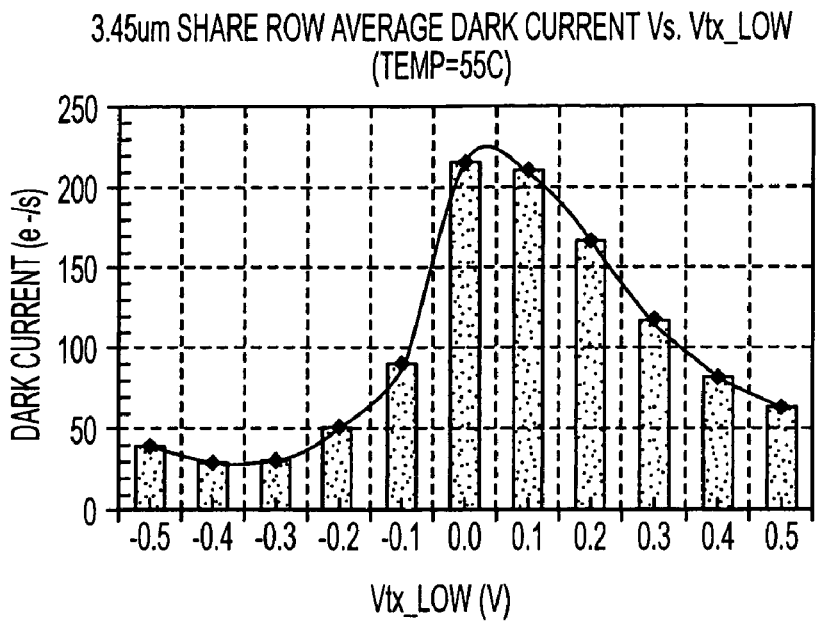
Figure 6F:
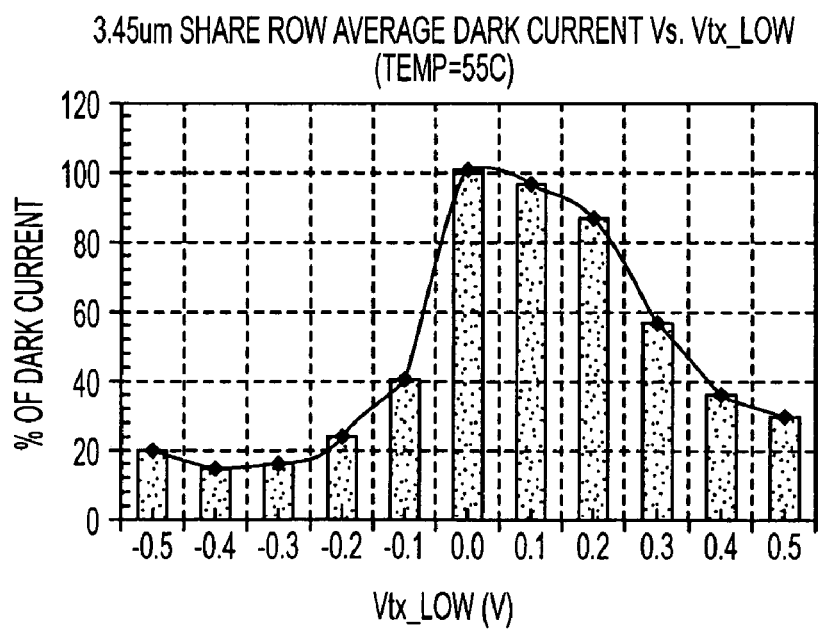

FIG. 6e illustrates the average dark current for the experimental array having 3.2 µm pixels while FIG. 6f illustrates the percentage of average dark current for the experimental array. As shown in the graphs, the percentage of dark current is dramatically reduced when either the small positive voltage or small negative voltage are applied to the transfer gates of the test pixel array during the acquisition period.

As can be seen from FIGS. 4a-6f, the inventions use of small positive or negative voltage on the transfer transistor gate during charge integration greatly reduces the average dark current value and quantity of hot pixels.

The inventors have determined that it may not be desirable to apply the small voltage VTX to the gate of the transfer transistor under all lighting conditions. For example, applying the small voltage VTX to the gate of the transfer transistor may result in an associated drop in the photosensor's full well capacity (and possibly lower its signal-to-noise ratio). This may not be desirable when the light intensity on the pixel is high. As another example, when the light intensity on the pixel is high and a small negative voltage VTX is applied to the gate of the transfer transistor, there may be some blooming, which preferably should be avoided.

Figure 7:
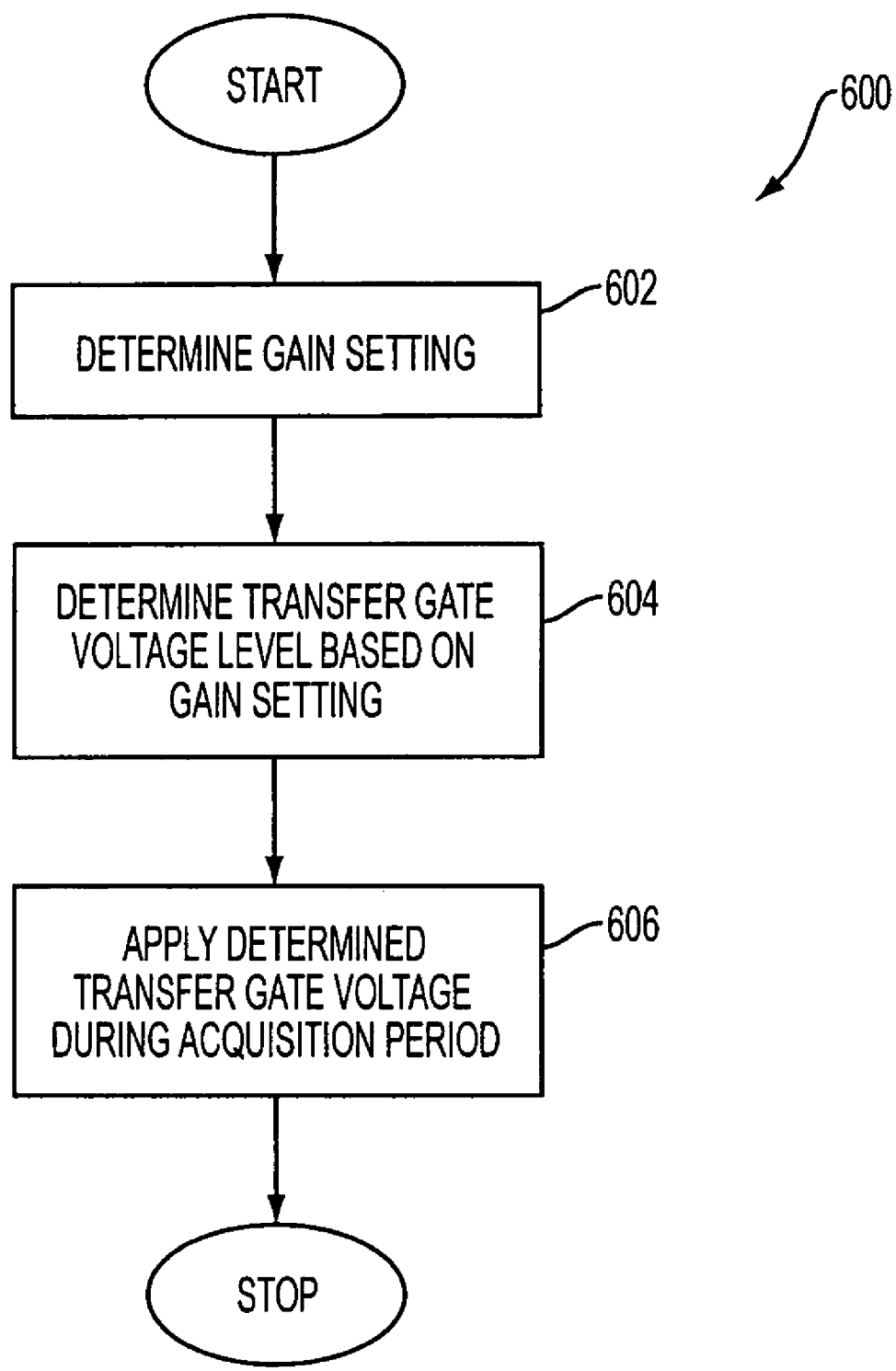
FIG. 7 is a flowchart illustrating the processing of another embodiment of the invention.

FIG. 7 illustrates a method 600 designed to tie the small voltage VTX applied to the gate of the transfer transistor during the acquisition period to the light intensity or gain setting of the imager to prevent any of the aforementioned undesirable effects from occurring. In normal imager operation, light intensity is monitored and an imager gain setting is set based on the monitored light intensity. For example, when the light intensity is low, indicating a dark condition, the imager's gain setting is usually set to a high value. Likewise, when the light intensity is high, indicating a bright condition, the imager's gain setting is usually set to a low value. The method 600 uses the imager's gain setting to determine what the voltage VTX being applied to the transfer transistor gate during the acquisition period should be.

Generally, it is desirable that the small positive or negative voltage be applied to the gate of the transfer transistor under high gain (or dark) conditions only. For low gain (or bright light) conditions, a ground potential or zero voltage is applied to the gate of the transfer transistor. For embodiments using a small positive voltage, this provides maximum hot pixel reduction for the high gain (dark) conditions, while allowing maximum full well capacity for the low gain (bright) conditions. For embodiments using a small negative voltage, this provides maximum electron recombination for the high gain (dark) conditions, while avoiding blooming issues during the low gain (bright) conditions.

The method 600 begins by determining the current gain setting for the imager (step 602). As set forth above, when the light intensity is low, indicating a dark condition, the imager's gain setting is usually set to a high value. When the light intensity is high, indicating a bright condition, the imager's gain setting is usually set to a low value. Once the gain setting is determined, the level of the voltage VTX to be applied to the transfer transistor gate during the acquisition period is determined (step 604). For example, when the gain setting is high, the transfer gate voltage VTX is set to a non-zero positive or negative voltage (as described above with respect to FIGS. 2a, 3a). When the gain setting is low, however, the transfer gate voltage VTX is set to a zero voltage (as described above with respect to FIG. 1b).

The values of the small voltage VTX can be pre-stored in a look-up table or hardware register depending upon how the method 600 is implemented. In one embodiment, the method 600 is implemented by an image processor or a control circuit of the imager (described below with respect to FIG. 9). In another embodiment, the voltage level can be determined by a user of the imager based on a measured gain setting. The user could use an interface, such as a serial interface, to set a register within the imager, which will set the voltage VTX to the desired value. Thus, the invention should not be limited to the exact technique used to implement the method 600.

Once the level of the voltage VTX to be applied to the transfer transistor gate is determined (step 604), the voltage VTX is applied to the gate of the transfer transistor during the acquisition period as described above with respect to FIGS. 2a and 3a. Method 600 may simply use one voltage level when the gain setting is above a predefine threshold and the zero voltage when the gain setting is below the predefine threshold.

Often times, however, there are intermediate gain settings between the high gain and low gain settings. The method 600 may use different voltages VTX for each different gain setting used in the imager. As such, the voltage VTX applied to the transfer gate is scaled according to the gain setting of the imager at that time. Thus, in another embodiment of the invention, step 604 would set the level of the transfer gate voltage VTX to one of a range of voltages based on a particular gain setting or range of gain settings as desired.

The following examples will help illustrate the above embodiments of the invention. In a first example, the exemplary voltages on the gate of the transfer transistor and associated gain conditions provide dark current and hot pixel reduction, and preserves maximum full well capacity: VTX=0 at gain range from 1 to 2, VTX=0.2 V at gain>2, VTX=0.4 V at gain>3, and VTX=0.6 V at gain>4. In a second example, the exemplary voltages and associated gain settings provide dark current and hot pixel reduction, while also allowing anti-blooming protection, and preserving full well capacity: VTX=0.05 V at gain range from 1 to 2, VTX=0.2 V at gain>2, VTX=0.4 V at gain>3, and VTX=0.6 V at gain>4. In a third example, the exemplary voltages and gain settings provide dark current and hot pixel reduction, while allowing anti-blooming protection and preserving full well capacity: VTX=0.05 V at gain range from 1 to 2, and VTX=−0.4 V at gain>2.

Figure 8A:
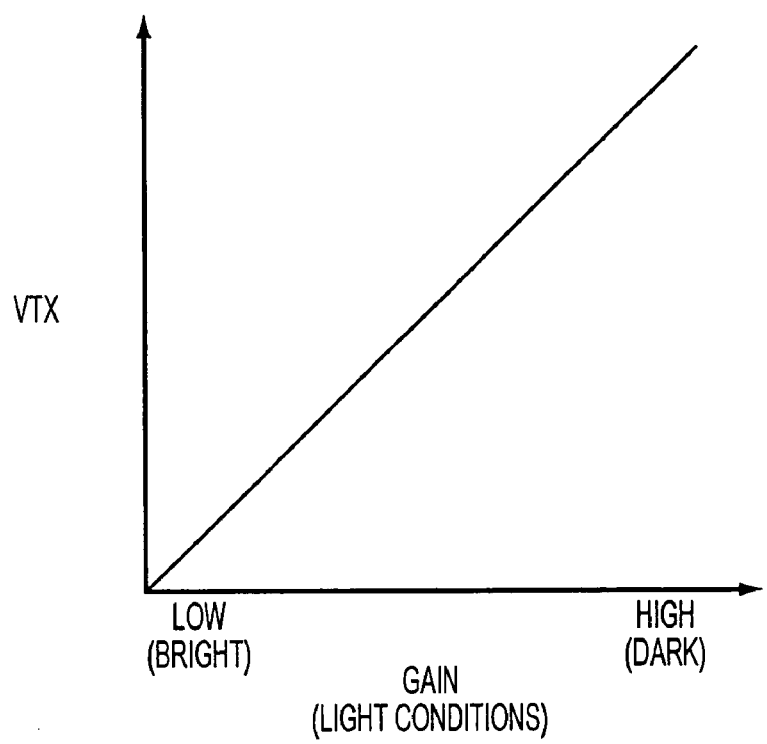
FIG. 8a shows an exemplary relationship of the small positive voltage and an imager's gain setting in accordance with the FIG. 7 embodiment of the invention.
Figure 8B:
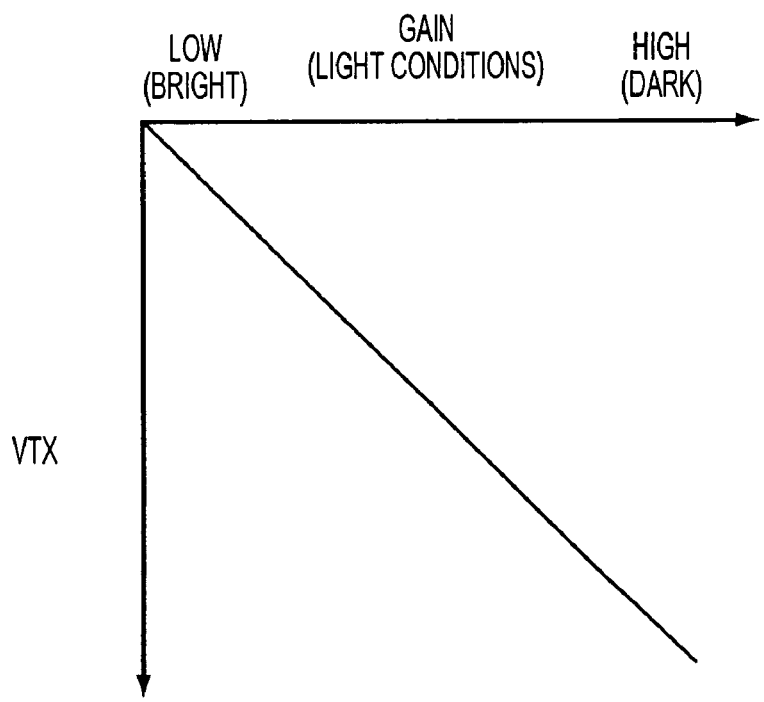
FIG. 8b shows an exemplary relationship of the small negative voltage and an imager's gain setting in accordance with the FIG. 7 embodiment of the invention.

FIG. 8a shows an exemplary relationship between the small positive voltage VTX and an imager's gain setting and FIG. 8b shows an exemplary relationship between the small negative voltage VTX and the imager's gain setting in accordance with the invention. As such, any transfer gate voltage VTX or range of transfer gate voltages, based on the associated applicable gain setting or range of setting, can be used to practice the invention.

Figure 9:
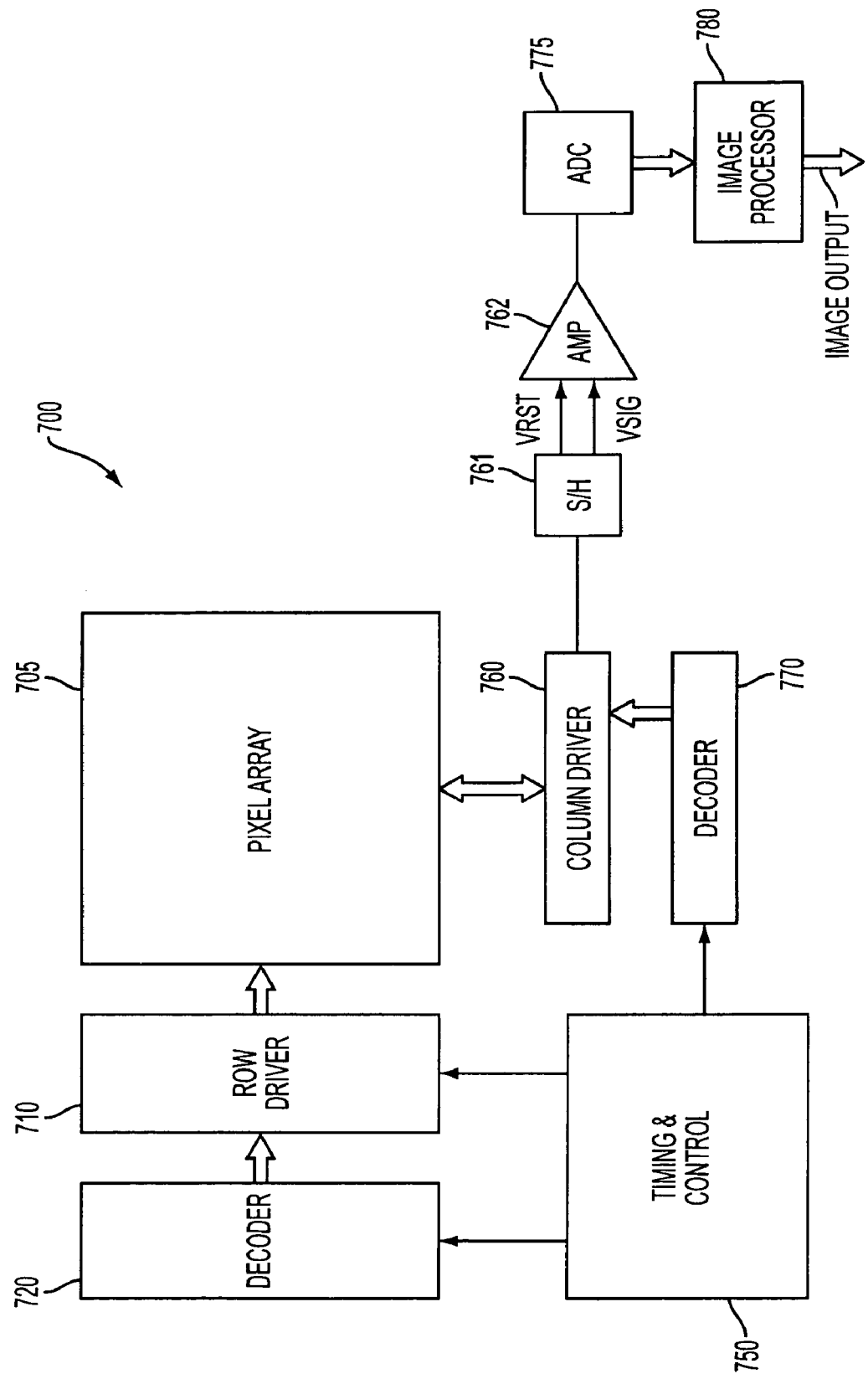
FIG. 9 shows an imager constructed in accordance with an embodiment of the invention.

FIG. 9 illustrates an exemplary imager 700 that may utilize any embodiment of the invention. The Imager 700 has a pixel array 705 comprising pixels constructed as described above with respect to FIG. 1a, or using other pixel architectures. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760 in accordance with an embodiment of the invention (i.e., FIG. 2a, FIG. 3a, FIG. 7).

A sample and hold circuit 761 associated with the column driver 760 reads a pixel reset signal Vrst and a pixel image signal Vsig for selected pixels. A differential signal (Vrst-Vsig) is amplified by differential amplifier 762 for each pixel and is digitized by analog-to-digital converter 775 (ADC). The analog-to-digital converter 775 supplies the digitized pixel signals to an image processor 780 which forms a digital image. The image processor 780 may also determine the gain setting of the imager 700, which can be used to set the level of the voltage applied to the pixels transfer gates (as described above with respect to FIG. 7).

Figure 10:
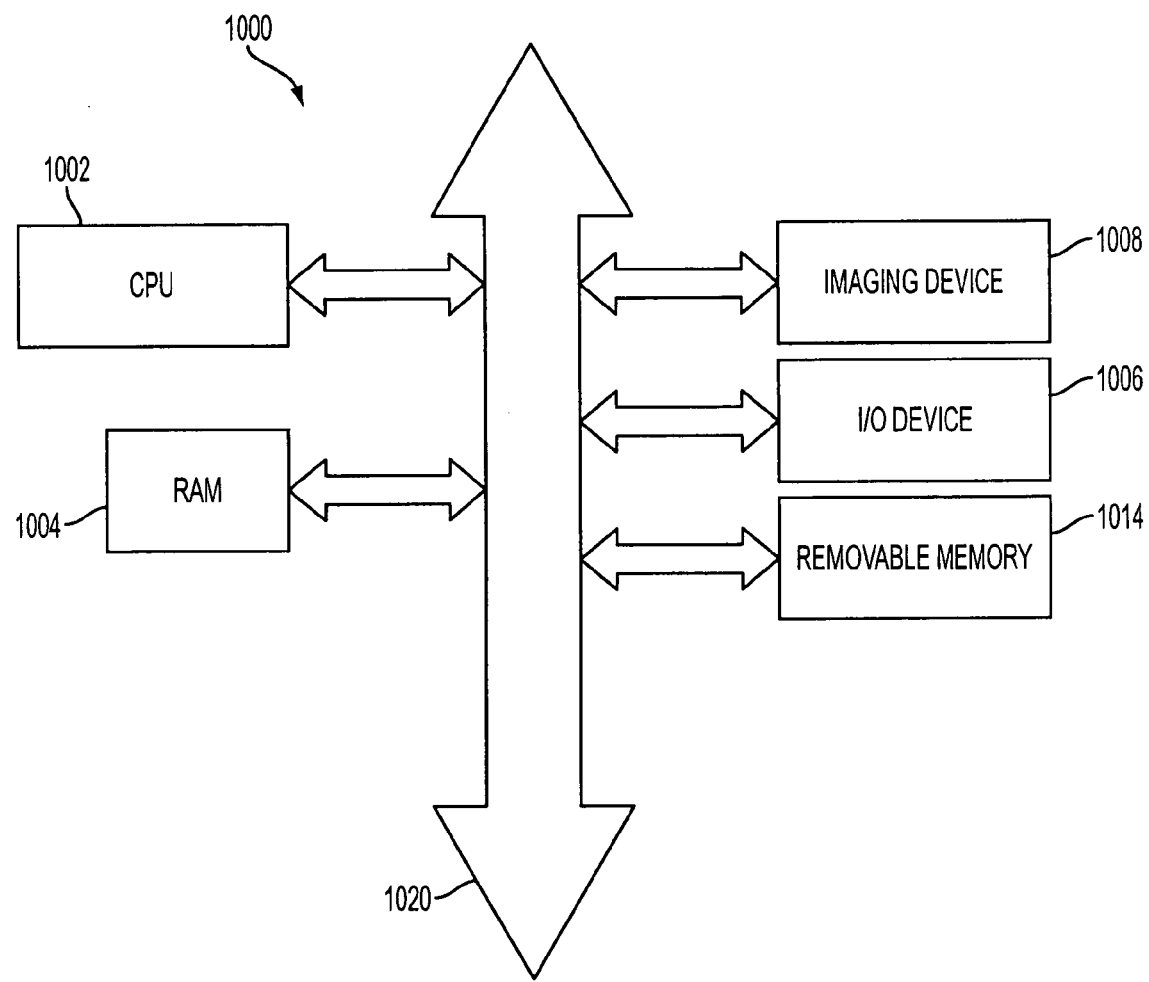
FIG. 10 shows a processor system incorporating at least one imager constructed in accordance with an embodiment of the invention.

FIG. 10 shows a system 1000, a typical processor system modified to include an imaging device 1008 (such as the imaging device 700 illustrated in FIG. 9) of the invention. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system, and other systems employing an imager.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM)1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

It should be noted that the invention has been described with reference to photodiode photosensors, but it should be appreciated that the invention may be utilized with any type of photosensor used in an imaging pixel circuit such as, but not limited to, photogates, photoconductors, photodiodes and pinned photodiodes and various configurations of photodiodes and pinned photodiodes.

It should also be appreciated that the small voltage does not need to be applied during the entire acquisition period. That is, the small voltage may be applied for only a portion of the charge acquisition period. It should also be appreciated that the imager of the invention could be designed to include all of the embodiments of the invention with a user selectable or application specific selectable option to determine which embodiment is performed during the operation of imager. For example, a hardware register could be used and set to indicate that the FIGS. 2a or 3a timing should be used or that method 600 should be used during the operation of the imager.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A method of operating an imager pixel circuit comprising a photosensor, a transfer gate and a floating diffusion region, said method comprising the acts of:
    initiating a charge acquisition period for the photosensor;
    determining a gain setting associated with the pixel circuit;
    applying a substantially zero voltage level to the transfer gate during the acquisition period under a first gain condition; and
    applying a non-zero voltage level to the transfer gate during the acquisition period under a second gain condition which represents a higher gain than said first gain condition,
wherein the level of the applied non-zero voltage is one of a plurality of non-zero voltages that is associated with a respective one of a plurality of gain settings.

2. The method of claim 1, wherein the non-zero voltage level is a positive voltage level.

3. The method of claim 1, further comprising the act of resetting the floating diffusion region after the acquisition period.

4. The method of claim 1, wherein the non-zero voltage level is applied during an entirety of the acquisition period.

5. The method of claim 1, wherein the voltage level is a negative voltage.

6. A method of operating an imager pixel circuit comprising a photosensor, a transfer gate and a floating diffusion region, said method comprising the acts of:
    initiating a charge acquisition period for the photosensor;
    determining a gain of the imager;

and
applying a positive voltage to the transfer gate during the acquisition periods which serves as a path for dark current electrons to flow to the floating diffusion region, wherein a level of the applied voltage is dependant upon a determined gain and is:
a substantially zero voltage level if said determined gain is a first gain level, one of a range plurality of non-zero voltage levels that is associated with a respective one of a plurality of gain settings if said determined gain is a second gain level, said second gain level being different from first gain level.

7. The method of claim 6, further comprising the act of resetting the floating diffusion region after the acquisition period.

8. The method of claim 6, wherein the voltage level is applied during an entirety of the acquisition period.

9. A method of operating an imager pixel circuit comprising a photosensor, a transfer gate and a floating diffusion region, said method comprising the acts of:
initiating a charge acquisition period for the photosensor;
determining a gain setting associated with the pixel circuit;
and combining dark electrons underneath the transfer gate with electron holes to substantially reduce a number of dark current electrons,
wherein the combining act comprises:
applying a substantially zero voltage to the transfer gate during the acquisition period under a first gain setting,
applying a negative voltage to the transfer gate during the acquisition period under a second gain setting, wherein a level of the applied voltage is one of a plurality of non-zero voltage levels that is associated with a respective one of a plurality of gain settings.

10. The method of claim 9, wherein the voltage is applied during an entirety of the acquisition period.

11. An imager comprising:
an array of pixels, each pixel comprising a photosensor, a transfer gate and a floating diffusion region; and
a control circuit electrically connected to said array, said control circuit configured to operate each pixel in a selected row by:
initiating a charge acquisition period for the photosensor, and
applying a voltage to the transfer gate of each pixel in the selected row during the acquisition period,
wherein said applied voltage is based on a gain setting of the imager,
wherein a level of the applied voltage is a substantially zero voltage level if said gain setting is a first gain setting,
wherein a level of the applied voltage is one of a plurality of non-zero voltage levels that is associated with a respective one of a plurality of gain settings if said gain setting is a second gain setting different from said first gain setting.

12. The imager of claim 11, wherein the voltage is a positive voltage.

13. The imager of claim 12, wherein the positive voltage is greater than approximately 0.0 volts, but no more than approximately 0.8 volts.

14. The imager of claim 11, wherein said control circuit further controls the pixel by resetting the floating diffusion region after the acquisition period.

15. The imager of claim 11, wherein the voltage is a negative voltage.

16. The imager of claim 15, wherein the negative voltage is less than approximately 0.0 volts, but not less than approximately −0.8 volts.

17. The imager of claim 11, wherein the non-zero voltage is applied during an entirety of the acquisition period.

18. A processor system comprising:
a processor; and
an imager coupled to said processor, said imager comprising:
an array of pixels, each pixel comprising a photosensor, a transfer gate, and a floating diffusion region; and
a control circuit electrically connected to said array,
said control circuit configured to determine a gain setting associated with each pixel, said control circuit configured to operate each pixel in a selected row by initiating a charge acquisition period for the photosensor and applying a voltage to the transfer gate of the pixel in the selected row during the acquisition period,
wherein the applied voltage is:
substantially zero under a first gain condition,
one of a plurality of non-zero voltage levels associated with a respective one of a plurality of gain settings under a second gain condition which represents a higher gain than said first gain condition.

19. The system of claim 18, wherein the voltage is a positive voltage.

20. The system of claim 19, wherein the voltage is greater than approximately 0.0 volts, but no more than approximately 0.8 volts.

21. The system of claim 19, wherein said control circuit is further configured to control the pixel by resetting the floating diffusion region after the acquisition period.

22. The system of claim 18, wherein the voltage is a negative voltage.

23. The system of claim 22, wherein the negative voltage is less than approximately 0.0 volts, but not less than approximately −0.8 volts.

24. A method of operating an imager pixel circuit comprising a photosensor, a transfer gate and a floating diffusion region, said method comprising the acts of:
initiating a charge acquisition period for the photosensor;
determining a light intensity associated with the pixel circuit;
applying a substantially zero voltage level to the transfer gate during the acquisition period under a first light intensity; and
applying one of a plurality of non-zero voltage levels to the transfer gate during the acquisition period in accordance with a determined level of light intensity under a second light intensity which represents a higher light intensity than said first light intensity.

25. The method of claim 24, wherein the voltage is a positive voltage.

26. The method of claim 24, wherein the voltage is a negative voltage.

27. An imager comprising:
an array of pixels, each pixel comprising a photosensor, a transfer gate, and a floating diffusion region; and
a control circuit electrically connected to said array,
said control circuit configured to determine a light intensity associated with the pixel, said control circuit configured to operate each pixel in a selected row by initiating a charge acquisition period for the photosensor and applying a voltage to the transfer gate of each pixel in the selected row during the acquisition period, wherein said applied voltage is:
 a substantially zero voltage level to the transfer gate during the acquisition period under a first light intensity,
 one of a plurality of non-zero voltage levels which corresponds to the detected light intensity on the imager under a second light intensity which represents a higher light intensity than said first light intensity.

28. The imager of claim 27, wherein the voltage is a positive voltage.

29. The imager of claim 27, wherein the voltage is a negative voltage.

\* \* \* \* \*

UNITED STATES PATENT AND TRADEMARK OFFICE
CERTIFICATE OF CORRECTION

PATENT NO. : 7,378,635 B2 Page 1 of 1
APPLICATION NO. : 11/055105
DATED : May 27, 2008
INVENTOR(S) : Agranov et al.

It is certified that error appears in the above-identified patent and that said Letters Patent is hereby corrected as shown below:

In column 11, line 3, in Claim 6, delete "periods" and insert -- period --, therefor.

In column 11, line 8, in Claim 6, after "a" delete "range".

Signed and Sealed this

Twenty-sixth Day of August, 2008

JON W. DUDAS
*Director of the United States Patent and Trademark Office*